United States Patent [19]

Chai

[11] Patent Number: 5,625,202
[45] Date of Patent: Apr. 29, 1997

[54] MODIFIED WURTZITE STRUCTURE OXIDE COMPOUNDS AS SUBSTRATES FOR III-V NITRIDE COMPOUND SEMICONDUCTOR EPITAXIAL THIN FILM GROWTH

[75] Inventor: Bruce H. T. Chai, Oviedo, Fla.

[73] Assignee: University of Central Florida, Orlando, Fla.

[21] Appl. No.: 488,741

[22] Filed: Jun. 8, 1995

[51] Int. Cl.$^6$ ................................................ H01L 33/00
[52] U.S. Cl. .......................... 257/94; 257/76; 257/103; 257/184; 257/200
[58] Field of Search .......................... 257/76, 94, 103, 257/184, 200, 613, 183, 79

[56] References Cited

U.S. PATENT DOCUMENTS

| | | | |
|---|---|---|---|
| 3,857,054 | 12/1974 | Lehmann et al. | 313/109 |
| 4,221,981 | 9/1980 | Deserno | 307/425 |
| 4,792,467 | 12/1988 | Melas et al. | 427/248.1 |
| 5,006,908 | 4/1991 | Matsuoka et al. | 357/17 |
| 5,162,930 | 11/1992 | Sluzky et al. | 359/50 |
| 5,274,251 | 12/1993 | Ota et al. | 257/78 |
| 5,300,793 | 4/1994 | Kondow et al. | 257/12 |
| 5,341,001 | 8/1994 | Hayashi et al. | 257/94 |
| 5,385,862 | 1/1995 | Moustakas | 437/107 |

OTHER PUBLICATIONS

O'Keeffe, et al. "Non-Bonded Interactions and the Crystal Chemistry of Tetrahedral S Related to the Wurtzite Type (BB4)" Jul. 3, 1978, Y. Dumas, pp. 3519–3528.

Scott, et al., "Crystal Growth and Properties of Pyroelectric Li2 GeO3", Mat.Res.Bull, pp. 1045–1050, Pergamon Press, Inc.

(List continued on next page.)

Primary Examiner—Mark V. Prenty
Assistant Examiner—Nathan K. Kelley
Attorney, Agent, or Firm—Brian S. Steinberger; Law Offices of Brian S. Steinberger

[57] ABSTRACT

Semiconductor light emitting and sensing devices are comprised of a lattice matching wurtzite structure oxide substrate and a III–V nitride compound semiconductor single crystal film epitaxially grown on the substrate. Single crystals of these oxides are grown and the substrates are produced. The lattice matching substrates include Lithium Aluminum Oxide ($LiAlO_2$), Lithium Gallium Oxide ($LiGaO_2$), Lithium Silicon Oxide ($Li_2SiO_3$), Lithium Germanium Oxide ($Li_2GeO_3$), Sodium Aluminum Oxide ($NaAlO_2$), Sodium Gallium Oxide ($NaGaO_2$), Sodium Germanium Oxide ($Na_2GeO_3$), Sodium Silicon Oxide ($Na_2SiO_3$), Lithium Phosphor Oxide ($Li_3PO_4$), Lithium Arsenic Oxide ($Li_3AsO_4$), Lithium Vanadium Oxide ($Li_3VO_4$), Lithium Magnesium Germanium Oxide ($Li_2MgGeO_4$), Lithium Zinc Germanium Oxide ($Li_2ZnGeO_4$), Lithium Cadmium Germanium Oxide ($Li_2CdGeO_4$), Lithium Magnesium Silicon Oxide ($Li_2MgSiO_4$), Lithium Zinc Silicon Oxide ($Li_2ZnSiO_4$), Lithium Cadmium Silicon Oxide ($Li_2CdSiO_4$), Sodium Magnesium Germanium Oxide ($Na_2MgGeO_4$), Sodium Zinc Germanium Oxide ($Na_2ZnGeO_4$) and Sodium Zinc Silicon Oxide ($Na_2ZnSiO_4$). These substrates are used to grow single crystal epitaxial films of III–V nitride compound semiconductors with the composition $Al_xIn_yGa_{1-x-y}N$ $0 \leq x \leq 1$, $0 \leq y \leq 1$, and $0 \leq x+y \leq 1$. The semiconductor light devices can also include mixed combinations of any two or more of the above listed compounds. Furthermore, the preferred lattice matching substrates can include all the above listed modified wurtzite structure oxide compounds and their mixed crystals with substitution of the following elements, Be, B, N, Cr, Mn, Fe, Co, Ni, Cu, In and Sb. With the exception of N which can partially replaces oxygen only, all the rest elements are able to replace partially the cations of the above mentioned wurtzite structure oxide compounds. The types of semiconductor light devices that use this invention include light emitting devices, laser diodes, optical pumped laser diodes and optical detectors such as photoluminescence sensors and photo detectors. The laser diode devices can include a lateral or vertical Fabry-Perot resonant cavity, with or without metal electrodes.

20 Claims, 11 Drawing Sheets

OTHER PUBLICATIONS

Marezio, "The Crystal Structure and Anomalous Dispersion of y–LiAlO2", Acta Cryst., 396–400.

Marezio, "The Crystal Structure of LiGaO2", Acta Cryst. (1965), 481–484.

Gunshor, et al., "Blue–green laser–diode technology moves ahead", Laser Focus World 1995, pp. 97–100.

Cook, et al. "Blue–green light–emitting diodes promise full–color displays", Laser Focus Wo 1995, pp. 101–104.

Higgins "The smaller, cheaper, faster world of the laser diode", Laser Foscus World, Apr. 76.

"Blue laser Diodes: Cree, Philips Team", New Technology Week, Monday, Apr. 10, 1995.

Bandgap vs Lattice Constant of AlN, GaN and InN

Note: A = Top DBR made of p-type AlGaN - InGaN interlayers
B = p-type spacer layer AlGaN
C = InGaN:Si,Zn active region
D = n-type spacer layer AlGaN
E = Bottom DBR made of n-type AlGaN - InGaN interlayers

MODIFIED WURTZITE STRUCTURE OXIDE COMPOUNDS AS SUBSTRATES FOR III-V NITRIDE COMPOUND SEMICONDUCTOR EPITAXIAL THIN FILM GROWTH

This invention relates to lattice matching crystals for epitaxial thin film growth, and in particular to methods of using modified oxide wurtzite compounds as substrates for growing wurtzite type III-V nitride compound semiconductor single crystal epitaxial films. Semiconductor light emitting diodes (LED), laser diodes (LD), optically pumped laser diodes and optical detectors such as photoluminescence sensors and photo detectors. The devices can be fabricated with multiple layer growth of such true epitaxial III-V nitride compound semiconductor single crystal thin films with proper p-type and n-type doping.

BACKGROUND AND PRIOR ART

Compound semiconductor laser diodes (LD) based on III-V materials such as GaAs have been in use for more than three decades. Current available LDs emit typically in the near infra-red spectral region. The most common applications of these LDs are in two specific areas, the optical-fiber communications and the compact disk (CD) players and CD ROMs. Although the visible LED and LD are highly desirable, in many applications especially in the display areas, they are not available due to the band gap limitation of the existing III-V compound semiconductor materials. In the last few years, red LD based on the quaternary Al—Ga—In—P system has produced light in the spectrum range of 630 to 670 nm region. Table 1 lists the currently available semiconductor LDs and their emitting wavelengths. From Table 1, it is quite clear that two of the most important color sources, blue (≈470 nm) and green (≈550 nm), are not available.

TABLE 1

Currently Available Semiconductor Laser Diodes and Their Emitting Wavelengths:

| Compound | Emitting Wavelengths (μm) |
|---|---|
| AlGaInP | 0.65–0.68 |
| $Ga_{0.5}In_{0.5}P$ | 0.67 |
| $Ga_{1-x}Al_xAs$ | 0.63–0.90 |
| GaAs | 0.90 |
| $In_{0.2}Ga_{0.8}As$ | 0.98 |
| $In_{1-x}Ga_xAs_yP_{1-y}$ | 1.10–1.65 |
| $In_{0.73}Ga_{0.27}As_{0.58}P_{0.42}$ | 1.31 |
| $In_{0.58}Ga_{0.42}As_{0.9}P_{0.1}$ | 1.55 |
| InGaAsSb | 1.7–4.4 |
| PbEuSeTe | 3.3–5.8 |
| PbSSe | 4.2–8.0 |
| PbSnTe | 6.3–29 |
| PbSnSe | 8.0–29 |

To achieve the blue and green LED and LD emissions, it has been necessary to use direct bandgap compound semiconductor materials with band gap sufficiently wide enough (>2–3 eV) to generate the blue or green transitions as shown in FIG. 1. Since the traditional semiconductor materials such as GaAs and InP do not have a sufficiently wide enough bandgap, one approach is to use the so-called wide-bandgap II-VI semiconductor materials such as ZnSe which has a band gap of 2.3 eV. The reason to use ZnSe is that its lattice matches reasonably well to that of GaAs and Ge so thin epitaxial thin films can be made using these readily available commercial substrates. However, the production of blue and green emissions is far from easy. It was not until 1991 with the combination of the development of multi-layer quantum-well heterostructures by the Molecular Beam Epitaxial (MBE) technique and the successful achievement of p-type doping using nitrogen make the fabrication of the injection laser device possible. At present the II-VI LD devices are fabricated on GaAs substrate with ZnMgSSe optical-cladding layers and ZnSSe waveguiding regions and two to three ZnCdSe quantum wells. The LD has operated successfully in cw (continuous wave) mode at 470 nm in liquid nitrogen temperature and at 508 nm at room temperature. Unfortunately the lifetime of cw room temperature operation is very short, and is typically less than one hour. This short lifetime is due to both the high ohmic contact resistivity and the high microstructural defects which act as nonradiative recombination centers at the gain region. The effort to overcome these basic problems has not been successful. A fundamental reason for why these problems exist is that these class of materials being used are simply too soft to tolerate lattice stresses produced by mismatching. Material strength is determined by its intrinsic chemical nature (the bonding strength) and is not changeable.

Another approach to achieve the same blue and green LED and LD emissions is to use the direct bandgap (2.8 eV) of SiC (6H). Indeed, blue LED based on SiC has been produced commercially but the efficiency is very poor due to the high microstructure defects of the SiC devices. In this case, the material is much stronger than ZnSe so that even with such a high density of defects, the device still works. To improve efficiency, the system requires high quality defect-free SiC single crystals to make the substrates. Unfortunately, SiC single crystal can only be grown at extremely high temperatures (>2300° C.) through a vapor transport process in order to achieve reasonable growth rates. This is an extremely difficult process. Current SiC substrates contain undesirable pipe-shaped voids. To improve the current bulk SiC growth technology to produce defect-free single crystal substrates is both difficult and costly. Thus, it is unlikely that SiC LED can be improved with the existing technology to produce efficient blue/green emissions.

A third approach to achieve the same blue and green LED and LD emissions is to use the direct energy wide-bandgap III-V nitride compound semiconductor materials such as AlN, GaN and InN. Again, producing blue and green emissions is difficult. In addition to the difficulty of producing the p-type doping layers, these compounds have another unique problem which does occur in other compound semiconductors. This additional problem is the lack of suitable substrate materials to grow high quality single crystal epitaxial thin films. Nevertheless, in December 1993, Nichia Chemical Co. of Japan has successfully developed a high brightness (100 times that of SiC LED) and high efficiency (3.8%) 450 nm blue LED based on a GaInN composition. However, Nichia's effort has the best performance but it is by no means the first disclosure on GaInN LEDs. There are many prior disclosures on the fabrication of GaInN LED such as U.S. Pat. No. 5,006,908 was issued to Nippon Telegraph and Telephone Co. (NTT) of Japan. In both Nichia and NTT cases, single crystal sapphire ($Al_2O_3$) substrates were used to grow the GaN LED thin films because no better substrate materials are available. Since the lattice match between the sapphire substrate and the deposited GaInN film is very poor, the defect concentration is very high (on the order of $10^9$–$10^{11}$ dislocations per $cm^2$). Nevertheless, since GaN is another physically strong material, similar to SiC, even with such a high defect density, the efficiency of these LED devices is still very high. Nichia's result showed that the GaN based compound semiconductor devices are the ideal candidates for LD applications. In late 1994, Cree Research Corporation of North Carolina has successfully fabricated high brightness blue LED based on GaN heterostructure films grown on SiC substrate. Despite the success of these blue LEDs, no one is able to produce any blue LDs based on these III-V nitride compound semiconductor materials.

The primary reason of failing to produce the blue GaN LDs is not because of the film deposition processes nor the impurity doping techniques. It is due to the lack of lattice matching substrates so that high quality GaN single crystal epitaxial films can not be produced. Since there is no lattice match between the GaN and the sapphire substrate, the active film is deposited over a buffer layer which is essentially fine polycrystalline mass. The overgrown active GaN layer can be highly oriented due to the preferential fast growth of those grains with [0001] orientation perpendicular to the surface. The large scattering loss at these grain boundaries is very difficult to overcome by the optical gain to achieve lasing.

III-V nitride compounds having the wurtzite structure which is hexagonal in symmetry, in general, have much smaller lattice constants (a-axis dimension=3.104Å for AlN, 3.180Å for GaN and 3.533 for InN) as compared to all the currently available semiconductor substrates which are all in cubic symmetry. See FIG. 1. Two of the most commonly known wurtzite structure compounds are SiC and ZnO. Both have lattice constants comparatively close to that of the III-V nitrides and both of them are considered and have been used as substrates for the epitaxial growth of nitride thin films. As previously mentioned, the Cree Corporation of North Carolina has succeeded to make a GaN blue LEDs on SiC substrate. However, both SiC and ZnO compounds have serious drawbacks and are not really suitable for this application.

SiC has an a-axis dimension of 3.076Å (Table 2) which is 0.72% smaller than AlN and 3.09% smaller than GaN. To achieve good quality epitaxial thin film growth, it is necessary to have the substrate lattice matched as closely as possible, preferably better than 0.01% and in some cases 0.1%. Clearly, SiC's match is not good for AlN and much worse for GaN. Since AlN already has the smallest lattice constant among the III-V nitride compounds, there is no chance for SiC to get an exact match to any nitride composition. This is one of the reasons why only LED and not LD has been produced with SiC substrate.

In addition to the poor lattice matching, SiC has three additional problems: growth, defects and fabrication. SiC single crystal is produced by physical vapor deposition method at very high temperatures (>2300° C.). The equipment is expensive and the growth process is slow. Moreover, current technology is limited to 30 mm in diameter and the maximum boule length is approximately 50 mm. Secondly, since the growth is invisible, it is not easy to control the growth process and the crystal defects can be very high, including inclusions and hallowed pipe defects. At present, there is no good solution to improve the growth and to eliminate these defects. Thirdly, SiC is a very hard material approaching to the hardness of diamond and it has been used extensively as abrasives. Therefore, wafer slicing and subsequent polishing are very slow processes. In addition, the combination of these problems further adds to the cost of these substrates. Based on these reasons, SiC is not a good substrate for III-V nitride compound semiconductor thin film growth.

Unlike SiC, the ZnO has a totally different set of problems. First, the a-axis lattice constant of 3.2496Å is 4.69% bigger than that of AlN and 2.19% bigger than that of GaN (Table 2). ZnO will not match any of the (Al,Ga)N thin film compositions. But, ZnO does match to the $Ga_{0.8}In_{0.2}N$ film composition. However, there are serious problems associated with the use of ZnO substrate. The first one is :growth. Even though ZnO has a melting temperature of 1975° C., it can not be grown by the standard Czochralski pulling technique due to the high vapor pressure. Single crystals of ZnO have been produced by physical vapor transport, chemical vapor transport, flux growth and hydrothermal growth. Among them only physical vapor transport and hydrothermal methods have produced crystals greater than 1 cm in dimension. Thus far, the growth rate of all these methods are slow and the crystal size is also small. The crystal can easily develop a twin structure which is also a problem. The second problem is the chemical stability. ZnO crystal sublimes at very low temperatures (<1000° C.) and also reacts with hydrogen at similar temperature range. Hydrogen is a common carrier for the metal organics chemical vapor deposition (MOCVD) process. As a consequence, a ZnO substrate will self-disintegrate at the GaN film deposition temperature. This is pan of the reason why no GaN LED has yet been made successfully on ZnO substrate.

The following is a summary of the state of the art of the blue/green LED and LD technologies and their problems:

(1) Both blue and green LEDs and LDs have been produced based on II-VI ZnSe compound semiconductors. Since these materials are softer than the carbides and nitrites, they suffer rapid device degradation with usage. The materials works well at cryogenic but not room temperatures.

(2) SiC LEDs have been produced commercially but they are not efficient due to high detect density. No LD has yet been produced based on SiC.

(3) High brightness blue LEDs are now produced commercially based on III-V nitride compound semiconductor materials. The nitride thin films are grown on sapphire ($Al_2O_3$) substrates and are not true epitaxial films. Nevertheless, long term room temperature operation has been demonstrated. Because of poor lattice match, no LD has yet been produced. Blue III-V nitride LEDs are also produced using SiC substrate, again no LD has yet been produced. No nitride LED nor LD has successfully been made on ZnO substrates.

SUMMARY OF THE INVENTION

The first object of the invention is to provide a substrate for the growth of III-V nitride compound semiconductor films.

The second object of this invention is to provide a substrate which is lattice matchable to produce single crystal epitaxial films of the III-V nitride compound semiconductor materials.

The third object of this invention is to provide a substrate which can have more than one crystallographic orientations that are lattice matchable to produce single crystal epitaxial films of the III-V nitride compound semiconductor materials.

The fourth object of this invention is to utilize these III-V nitride compound semiconductor epitaxial films to produce light emitting diodes (LEDs) which include a p-n or metal-insulator-n structure with or without heterojunction structure and with or without one or more quantum wells.

The fifth object of this invention is to provide light emitting devices (LEDs) capable to produce a wide range of colors from ultraviolet (UV) to red.

The sixth object of this invention is to utilize these III–V nitride compound semiconductor epitaxial films to produce laser diodes (LDs) which include a p-n or metal-insulator-n structure with or without heterojunction structure and with or without one or more quantum wells and with an internal or external Fabry-Perot resonant cavity.

The seventh object of this invention is to provide laser diodes (LDs) capable to produce a wide range of colors from ultraviolet (UV) to red.

The eighth object of this invention is to utilize these III–V nitride compound semiconductor epitaxial films to produce optical (including photoluminescence) sensors and detectors which include a p-n or metal-insulator-n structure with or without heterojunction structure and with or without one or more quantum wells.

The ninth object of this invention is to provide optical (including photoluminescence) sensors and detectors capable to sense a wide range of colors from ultraviolet (UV) to red.

The tenth object of this invention is to utilize these III–V nitride compound semiconductor epitaxial films to produce optically pumped laser diodes (LDs) with an internal or external Fabry-Perot resonant cavities.

The eleventh object of this invention is to provide optically pumped laser diodes capable to produce a wide range of colors from ultraviolet (UV) to red.

In order to achieve the above objects of the present invention, there is provided an epitaxial growth structure comprising at least one of the preferred substrates and a wurtzite type III–V nitride compound semiconductor single crystal films epitaxially grown on the substrate. The lattice matching between the substrate and the epitaxial films has to be substantially close to ensure true epitaxial single crystal film growth.

The preferred lattice matching substrates for III–V nitride compound semiconductor thin film deposition are modified wurtzite structure oxide compounds. The preferred wurtzite compounds include Lithium Aluminum Oxide ($LiAlO_2$), Sodium Aluminum Oxide ($NaAlO_2$), Lithium Gallium Oxide ($LiGaO_2$), Sodium Gallium Oxide ($NaGaO_2$), Lithium Germanium Oxide ($Li_2GeO_3$), Sodium Germanium Oxide ($Na_2GeO_3$), Lithium Silicon Oxide ($Li_2SiO_3$), Sodium Silicon Oxide ($Na_2SiO_3$), Lithium Phosphor Oxide ($Li_3PO_4$), Lithium Arsenic Oxide ($Li_3AsO_4$), Lithium Vanadium Oxide ($Li_3VO_4$), Lithium Magnesium Germanium Oxide ($Li_2MgGeO_4$), Lithium Zinc Germanium Oxide ($Li_2ZnGeO_4$), Lithium Cadmium Germanium Oxide ($Li_2CdGeO_4$), Lithium Magnesium Silicon Oxide ($Li_2MgSiO_4$), Lithium Zinc Silicon Oxide ($Li_2ZnSiO_4$), Lithium Cadmium Silicon Oxide ($Li_2CdSiO_4$), Sodium Magnesium Germanium Oxide ($Na_2MgGeO_4$), Sodium Zinc Germanium Oxide ($Na_2ZnGeO_4$) and Sodium Zinc Silicon Oxide ($Na_2ZnSiO_4$). The preferred lattice matching substrates also include mixed crystals from any two or more of the above listed modified wurtzite structure oxide compounds. Furthermore, the preferred lattice matching substrates include all the above listed modified wurtzite structure oxide compounds and their mixed crystals with substitution of the following elements, Be, B, N, Cr, Mn, Fe, Co, Ni, Cu, In and Sb. With the exception of N which can partially replaces oxygen only, all the rest of these elements are able to replace partially the cations of the above mentioned wurtzite structure oxide compounds.

Further objects and advantages of this invention will be apparent from the following detailed description of presently preferred embodiments which are illustrated schematically in the accompanying drawings.

DESCRIPTION OF THE PREFERRED EMBODIMENT

Before explaining the disclosed embodiment of the present invention in detail it is to be understood that the invention is not limited in its application to the details of the particular arrangement shown since the invention is capable of other embodiments. Also, the terminology used herein is for the purpose of description and not of limitation.

In the section of background and prior art, detailed description is given for the three approaches to achieve UV and short visible (blue to green) light emission in LEDs and LDs. It is clear that the II–VI wide bandgap compound semiconductor approach and the SiC approach are limited by the fundamental physics and material properties. The limitation on III–V nitride compound semiconductors is very different in nature. It is not limited by the fundamental physics nor material properties but rather the poor lattice matching to the substrate materials so that high quality single crystal epitaxial films can not be produced. Therefore, the first embodiment is the detailed description of the identification of lattice matching substrates.

FIRST EMBODIMENT

Figure 3:
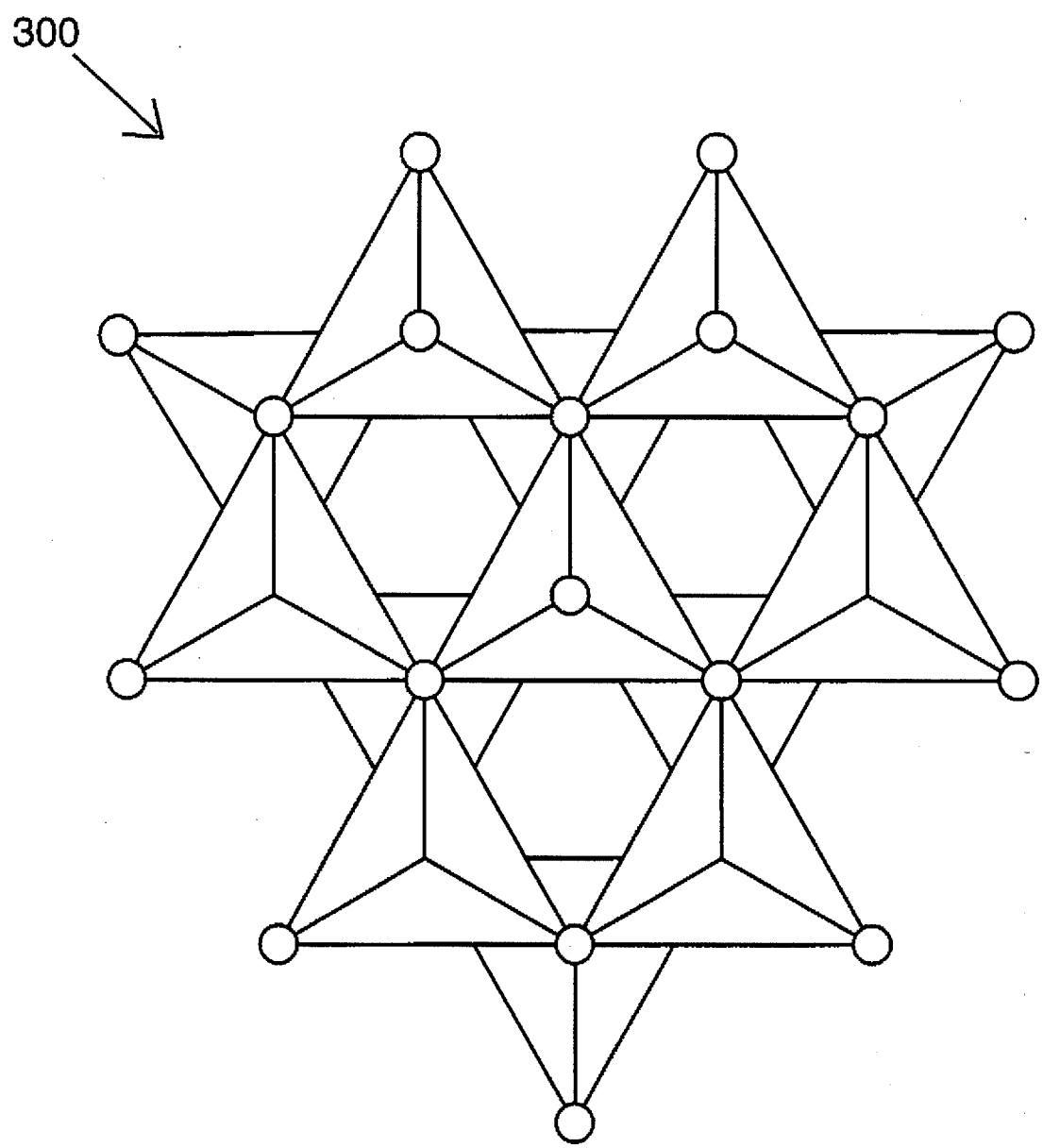
FIG. 3 illustrates the wurtzite structure projected on (0001) face.
Figure 4:
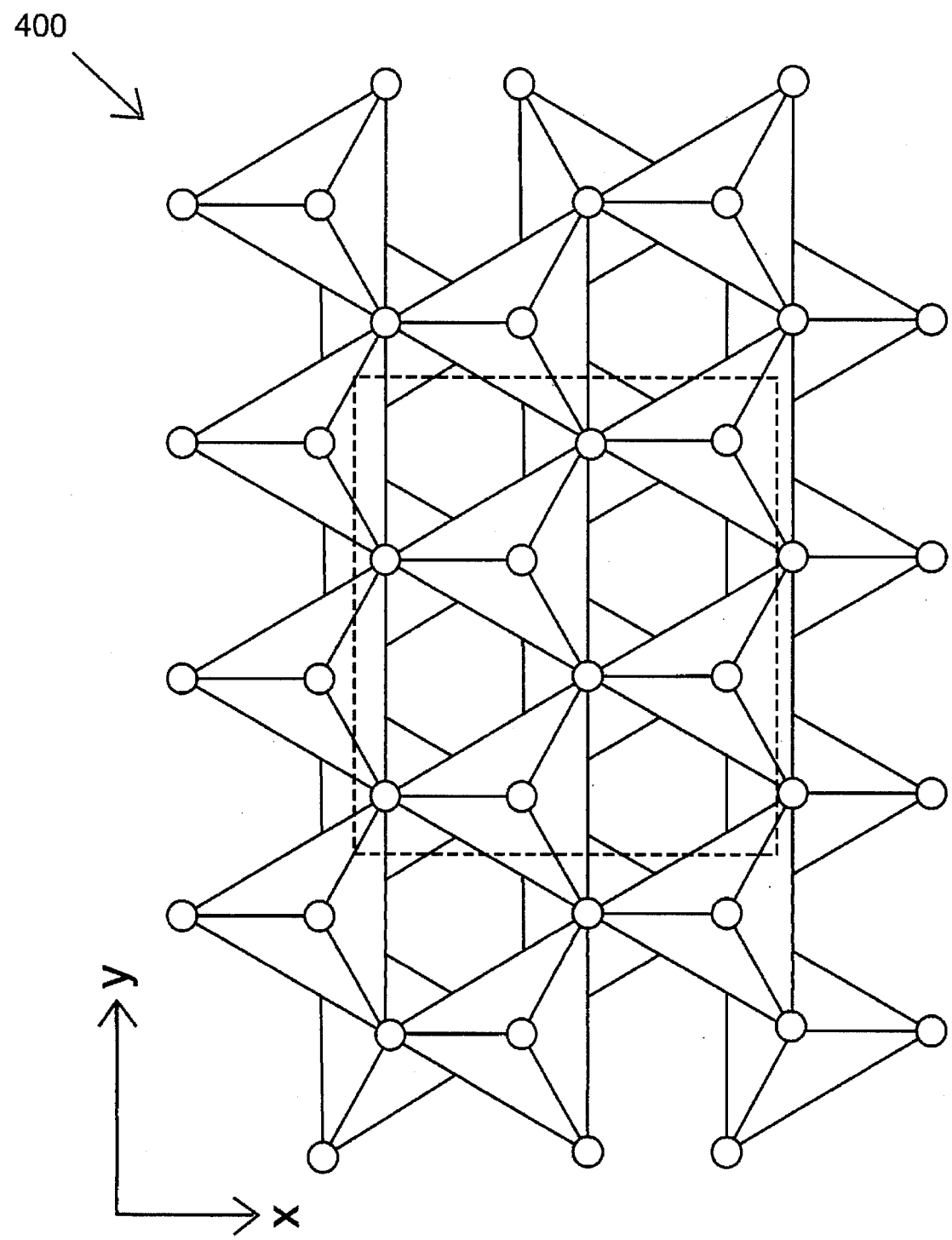
FIG. 4 illustrates the $LiAlO_2$ or $LiGaO_2$ structure in the same orientation as FIG. 3.
Figure 5:
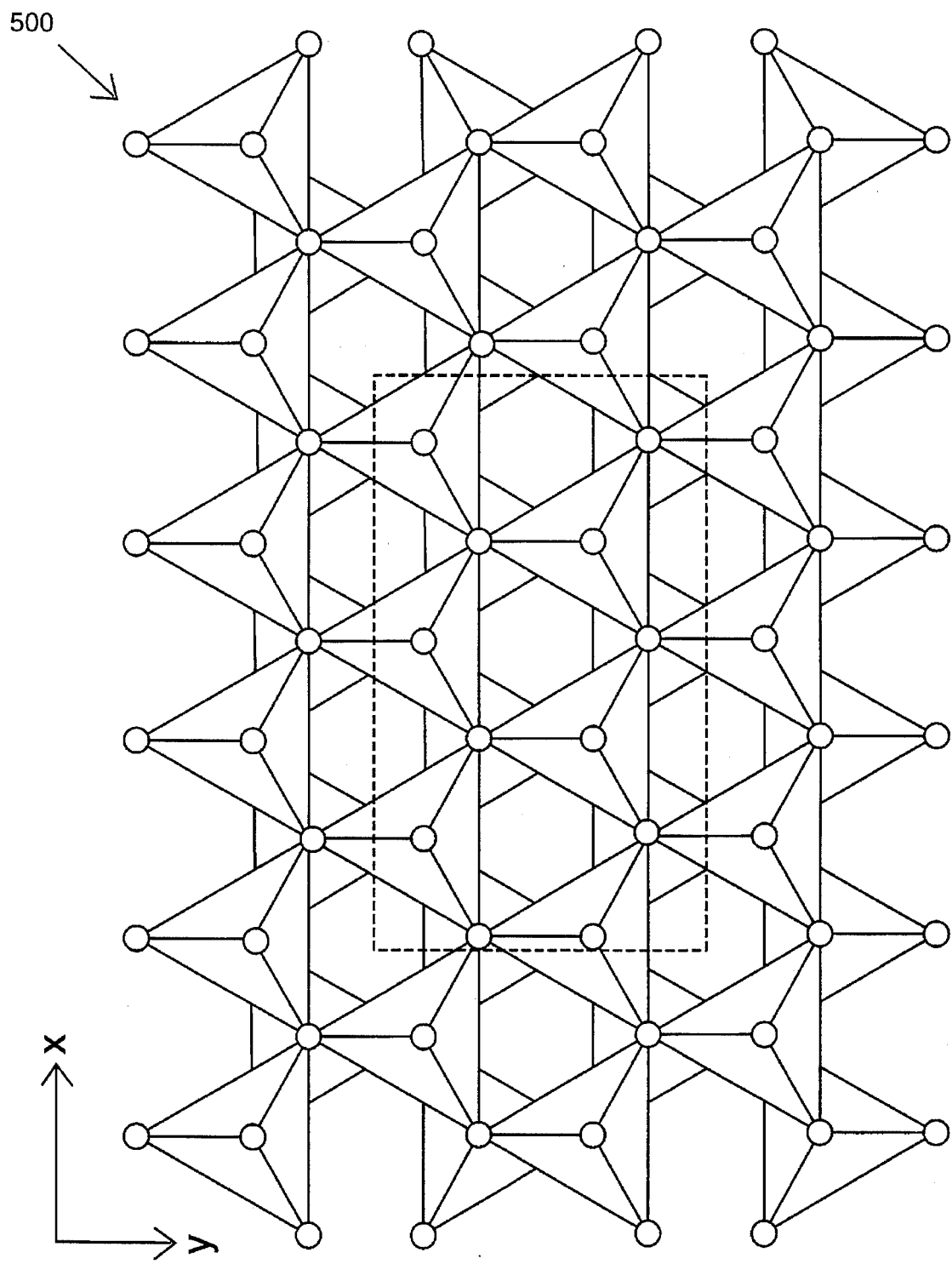
FIG. 5 illustrates the $Li_2SiO_3$ or $Li_2GeO_3$ structure in the same orientation as FIG. 3.
Figure 6:
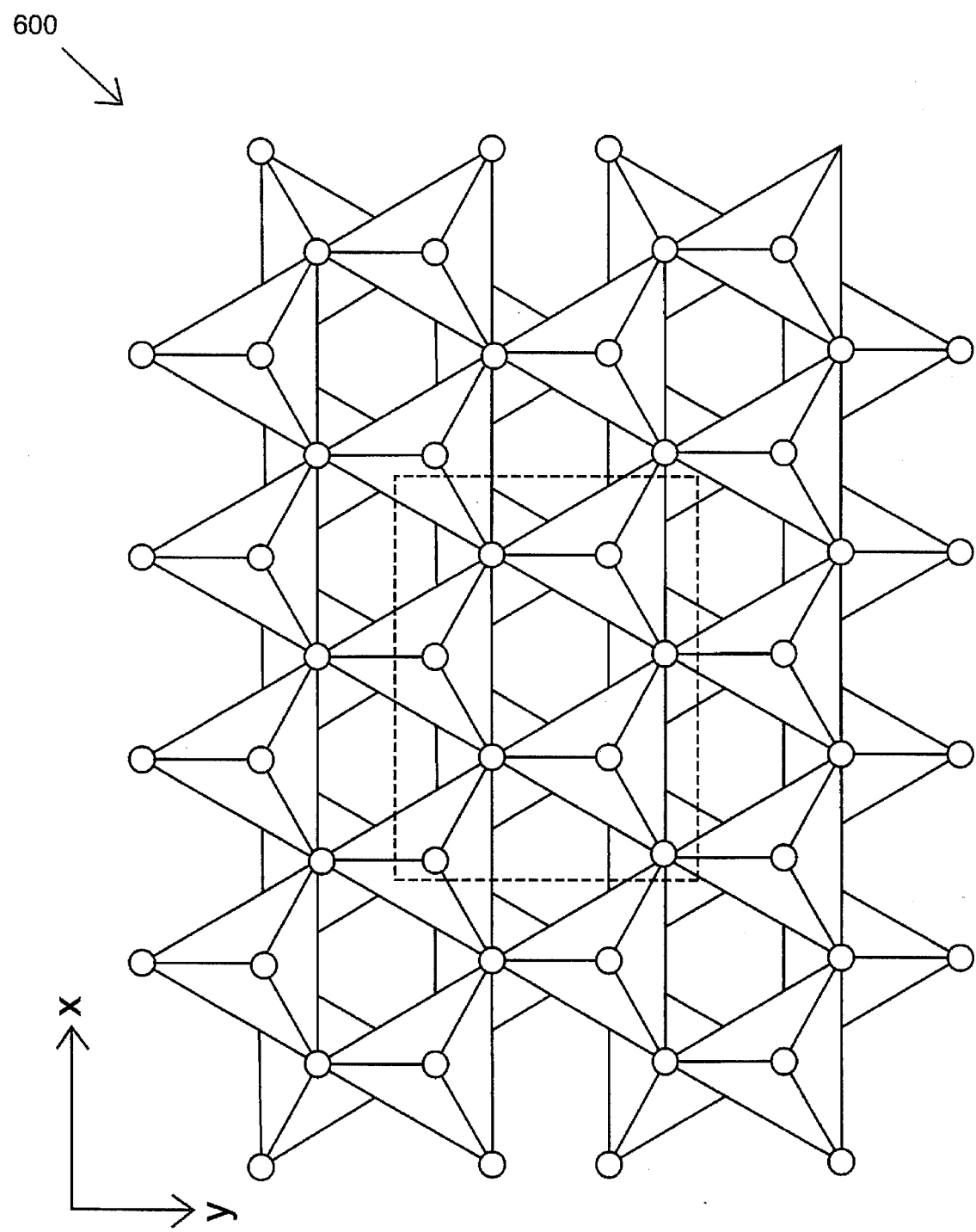
FIG. 6 illustrates the $Li_3PO_4$ or $Li_3AsO_4$ structure in the same orientation as FIG. 3.

The III–V nitrides such as AlN, GaN and InN all have a wurtzite structure which is a hcp (hexagonal close packing) structure with the space group of $P6_3mc$ as shown by 300 FIG. 3. Among the oxide compounds, only BeO and ZnO has the same structure. BeO has too small a lattice constant (a=2.698Å, c=4.377Å) to match to any of the nitrides whereas ZnO has many problems of its own as mentioned in the background section of this invention. In this embodiment, we identify a large class of lattice matchable ternary (three components) and quaternary (four components) oxide compounds with the modified wurtzite structure and lower crystallographic symmetry (Table 2). The lower of symmetry is due to the small lattice distortion originated from the ordering and size difference of these substituted cations. This substitution arrangement can be generalized into three groups: $ABO_2$, $A_2BO_3$ and $A_2BCO_4$, where A, B and C are cations, O is oxygen and A+B+C=0. However, looking the two dimensional views along the equivalent wurtzite c-axis [0001] direction, it is clear that the basic atomic arrangement is identical to the basic wurtzite structure. See 400 FIG. 4, 500 FIG. 5, and 600 FIG. 6 as compared to FIG. 3. These compounds are listed in Table 2 with other relevant compounds for comparison.

TABLE 2

Lattice constants of the III-V nitrides, commercial substrate, materials and the lattice matchable modified Wurtzite structure compounds

| Space Group | Compound | Conventional orientation | | | Matched Orientation | |
|---|---|---|---|---|---|---|
| | | a= | b= | c= | a= | c= |
| P6₃mc | AlN | 3.104 | | 4.966 | 3.104 | 4.966 |
| | GaN | 3.180 | | 5.168 | 3.180 | 5.168 |
| | InN | 3.533 | | 5.692 | 3.533 | 5.692 |
| R3̄c | Sapphire | 4.758 | | 12.991 | 2.747 | 4.330 |
| F4̄3m | GaP | 5.447 | | | 5.447 | |
| | GaAs | 5.654 | | | 5.654 | |
| P6₃mc | SiC | 3.082 | | 15.112 | 3.082 | 5.037 |
| | BeO | 2.698 | | 4.377 | 2.698 | 4.377 |
| | ZnO | 3.249 | | 5.206 | 3.249 | 5.206 |
| P4₁2₁2 | LiAlO₂ | 5.169 | | 6.268 | 3.134 | 5.169 |
| Pna2₁ | LiGaO₂ | 5.402 | 6.372 | 5.007 | 3.186 | 5.007 |
| | NaAlO₂ | 5.376 | 7.075 | 5.216 | 3.538 | 5.216 |
| | NaGaO₂ | 5.519 | 7.201 | 5.301 | 3.601 | 5.301 |
| Cmc2₁ | Li₂SiO₃ | 9.397 | 5.397 | 4.662 | 3.136 | 4.662 |
| | Li₂GeO₃ | 9.630 | 5.465 | 4.850 | 3.210 | 4.850 |
| | Na₂SiO₃ | 10.484 | 6.070 | 4.813 | 3.495 | 4.813 |
| | Na₂GeO₃ | 10.85 | 6.225 | 4.930 | 3.617 | 4.930 |
| Pmn2₁ | Li₃PO₄ | 6.115 | 5.239 | 4.855 | 3.058 | 4.855 |
| | Li₃AsO₄ | 6.27 | 5.38 | 4.95 | 3.135 | 4.95 |
| | Li₃VO₄ | 6.33 | 5.45 | 4.96 | 3.165 | 4.96 |
| | Li₂MgGeO₄ | 6.39 | 5.48 | 4.99 | 3.195 | 4.99 |
| | Li₂ZnSiO₄ | 6.13 | 5.37 | 4.94 | 3.065 | 4.94 |
| | Li₂ZnGeO₄ | 6.36 | 5.43 | 5.02 | 3.18 | 5.02 |
| | Li₂CdSiO₄ | 6.47 | 5.35 | 5.10 | 3.235 | 5.10 |
| | Li₂CdGeO₄ | 6.64 | 5.47 | 5.13 | 3.32 | 5.13 |
| | Na₂MgGeO₄ | 7.45 | 5.60 | 5.35 | 3.73 | 5.35 |
| | Na₂ZnSiO₄ | 7.02 | 5.44 | 5.24 | 3.51 | 5.24 |
| | Na₂ZnGeO₄ | 7.17 | 5.56 | 5.32 | 3.59 | 5.32 |

In Table 2, a total of 19 pure ternary and quaternary oxide compounds are identified as usable substrate materials. The usefulness of these compounds as substrate materials is not limited to the compositions by themselves but also on their mixed crystals (or solid solutions) with two or more of these 19 compounds as end members. In addition, these compositions including their solid solutions can also be partially or completely substituted by Be, B, N, Cr, Mn, Fe, Co, Ni, Cu, In and Sb. With the exception of N which can partially replaces oxygen only, all the rest of these elements are able to replace partially the cations of the above mentioned wurtzite structure oxide compounds.

The close lattice matching of these proposed compounds listed in Table 2 can be further understood based on a simplified chemical bond length argument. Since all these compounds have essentially the same structure in view from the equivalent wurtzite structure (0001) plane, the average cation-anion bond length can give the first approximation of the closeness of the lattice matching among the compounds. The comparison of the average bond length of the simple ternary oxide compounds relative to the III-V nitrides is illustrated in Table 3.

TABLE 3

Comparison of the average bond length of simple ternary modified wurtzite structure compounds relative to the III-V nitrides:

| Compound | Cation-Anion Bond Length (Å) | Average Bond Length (Å) |
|---|---|---|
| AlN | Al—N = 1.85 | 1.85 |
| GaN | Ga—N = 1.93 | 1.93 |
| InN | In—N = 2.08 | 2.08 |
| SiC | Si—C = 1.80 | 1.80 |
| ZnO | Zn—O = 1.98 | 1.98 |
| LiAlO₂ | Li—O = 1.97, Al—O = 1.77 | 1.87 |
| Li₂SiO₃ | Li—O = 1.97, Si—O = 1.64 | 1.86 |
| LiGaO₂ | Li—O = 1.97, Ga—O = 1.85 | 1.91 |
| Li₂GeO₃ | Li—O = 1.97, Ge—O = 1.77 | 1.90 |
| NaAlO₂ | Na—O = 2.37, Al—O = 1.77 | 2.07 |
| NaGaO₂ | Na—O = 2.37, Ga—O = 1.85 | 2.11 |
| Na₂SiO₃ | Na—O = 2.37, Si—O = 1.64 | 2.13 |
| Na₂GeO₃ | Na—O = 2.37, Ge—O = 1.85 | 2.20 |

Even though the comparison method used in Table 3 is very crude, the result is consistent with that of the lattice parameter comparison listed in Table 2. The result from Table 3 also shows that LiAlO₂ and Li₂SiO₃ match better to AlN as compared to SiC, whereas LiGaO₂ and Li₂GeO₃ match well to GaN. In the case of InN, only NaAlO₂ and possibly NaGaO₂ matches reasonably well. This match is because nitrogen (1.46Å) is bigger than oxygen (1.35Å) and the large size of the indium ion has pushed the four-fold coordination of nitrides to the extreme. As for oxides, the simple ternary indium containing compounds can not maintain the four-fold coordination but have to change to NaCl (or rock salt) structure as in the case of LiInO₂. For single charge cation such as Na, the electron cloud is more compressible and deformable. Therefore, it is able to retain in four-fold coordination despite of the large size. However, the large difference of the Na—O bond relative to Al—O or Ga—O bond will produce more distortion in the structure. It also makes the overall structure less stable and subjects to phase transitions.

SECOND EMBODIMENT

The second embodiment will describe the manufacturing processes of the lattice matching substrates. After the identification of these modified wurtzite oxide compounds which have lattice constants closely matched to the III-V nitride compound semiconductors, we produce these crystals in the following examples:

Example 1

388 grams of Li₂CO₃ and 510 grams of Al₂O₃ are mixed and heated in an Iridium crucible to 1700° C. to melt. Single crystal of LiAlO₂ is grown by the Czochralski pulling technique. A single crystal boule weighing 455 grams with a diameter of 32 mm and 200 mm long is produced. Single crystal wafers are sliced along (001) and (100) orientations and polished to be used for III-V nitride compound semiconductor thin film deposition.

Example 2

310 grams of Li₂CO₃ and 750 grams of Ga₂O₃ are mixed and heated in an Iridium crucible to 1550° C. to melt. Single crystal of LiGaO₂ is grown by the Czochralski pulling technique. A single crystal boule weighing 566 grams with a diameter of 32 mm and 180 mm long is produced. Single crystal wafers are sliced along (001) and (100) orientations and polished to be used for III–V nitride compound semiconductor thin film deposition.

Example 3

207 grams of $Li_2CO_3$ and 293 grams of $GeO_2$ are mixed and heated in an Platinum crucible to 1300° C. to melt. Single crystal of $Li_2GeO_3$ is grown by the Czochralski pulling technique. A single crystal boule weighing 258 grams with a cross-section of 16×30 mm and 120 mm long is produced. Single crystal wafers are sliced along (001) and (010) orientations and polished to be used for III–V nitride compound semiconductor thin film deposition.

Example 4

222 grams of $Li_2CO_3$ and 180 grams of $SiO_2$ are mixed and heated in an Platinum crucible to 1300° C. to melt. Single crystal of $Li_2SiO_3$ is grown by the Czochralski pulling technique. A single crystal boule weighing 98 grams with a cross-section of 14×21 mm and 100 mm long is produced. Single crystal wafers are sliced along (001) and (010) orientations and polished to be used for III–V nitride compound semiconductor thin film deposition.

The embodiments illustrate the method to produce the modified wurtzite structure oxide compounds if the compound melts congruently. Obviously, not all the modified wurtzite structure oxide compounds listed in Table 2 melt congruently. For those non-congruent melting compounds, they have to be grown by the flux method which is known in the art. The appropriate charge of oxide and carbonate corresponding to the compound to be grown (for example: $Li_2CO_3$, MgO and $GeO_2$ will be used to grow $Li_2MgGeO_4$ single crystals) will be melted in a flux which is a mixture of PbO and $B_2O_3$. The charge will be heated up to 1300° C. to homogenize and then cooled down slowly at 1° to 30° C. per day with or without a seed either submerged or pulled slowly (1 to 20 mm per day) to grow these crystals. Following the growth, the crystal will be oriented, cut and polished to produce wafers for III–V nitride compound semiconductor thin film deposition.

THIRD EMBODIMENT

The third embodiment will describe the epitaxial deposition of single crystal III–V nitride compound semiconductor thin films on these substrates and the adjustment of the bandgaps to produce wide range of colors from ultraviolet (UV) to red for the manufacturing of light emitting diodes (LEDs). The techniques to deposit III–V nitride compound semiconductor thin films are well known in the art. The two most common techniques are molecular beam epitaxy (MBE) and metal organic chemical vapor deposition (MOCVD). Thin films of III–V nitride compound semiconductors with both n- and p-type dopings have been produced by either method. It is not the intention in this embodiment to describe the detailed deposition processes by either method since they are well known in the art. This embodiment describes the manufacturing of single crystal epitaxial films of III–V nitride compound semiconductors in large continuous areas over the entire substrate wafer. So far, because of lacking lattice matching substrate all these films deposited are either totally polycrystalline or homotaxial grains with the same azimuthal orientation, or epitaxial grains with the same azimuthal and texture orientation but not continuous and with high number of grain boundaries and dislocations ($10^9$ to $10^{11}$ per cm$^2$).

An (001) orientation polished $LiAlO_2$ wafer (25×25 mm$^2$) is mounted on a susceptor placed inside a MBE machine. The substrate is heated to 800° C. and gallium vapor is introduced tram one of the orifice and active nitrogen atomic gas is introduced with a plasma gun. The crystallinity of the deposition is monitored in situ continuously with reflection high energy electron diffraction (RHEED) image. Single crystal epitaxial film is produced as evidenced by the regular streaks of diffraction spots.

Figure 1:
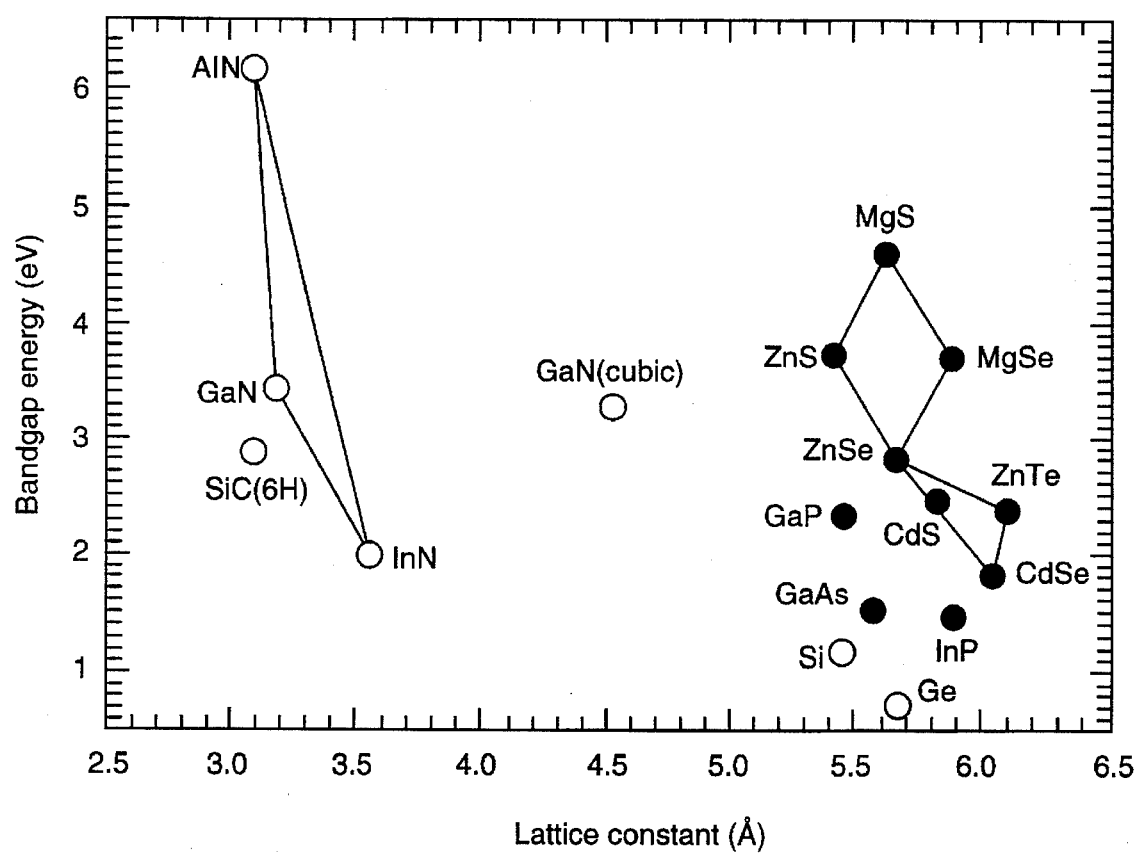
FIG. 1 shows the bandgap energy (eV) versus lattice constant plot showing the large lattice difference between the III–V nitrides, and II–VI compounds. Notice that the II–VI compounds matches to the commercially available Si, Ge, GaP, GaAs and InP substrate materials.
Figure 2:
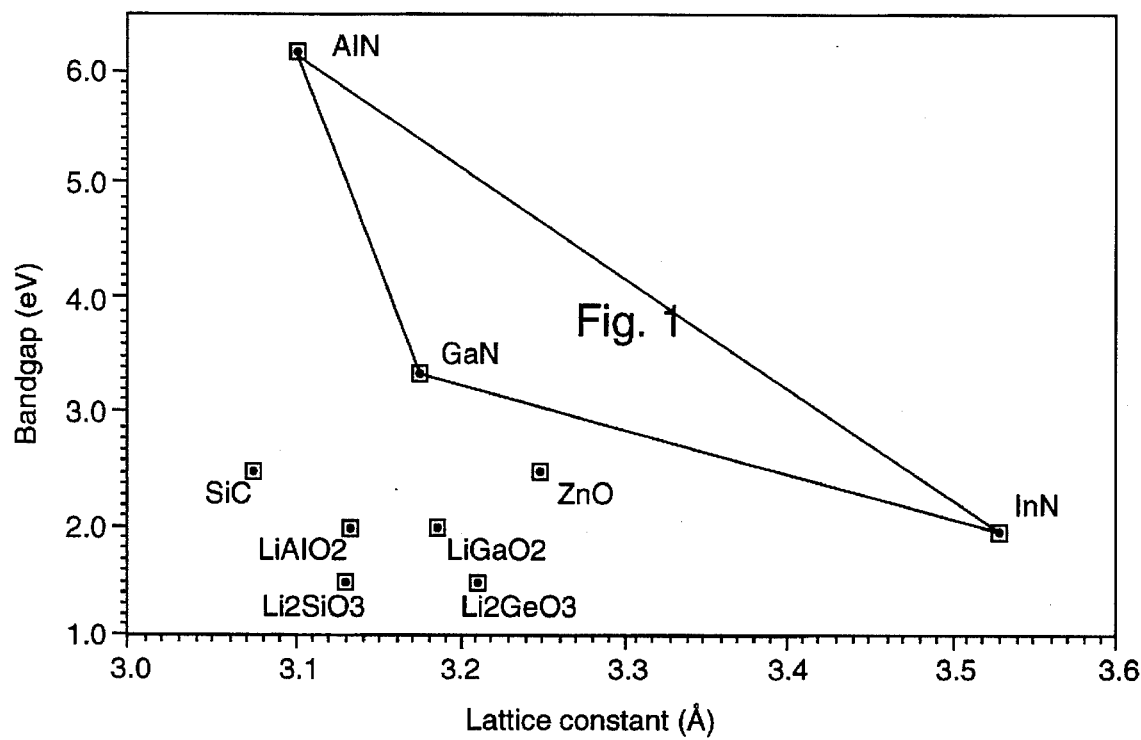
FIG. 2 illustrates the details of the bandgap energy (eV) versus lattice constant plot specifically in the III–V nitride region with some of the proposed lattice matching substrates.
Figure 7A:
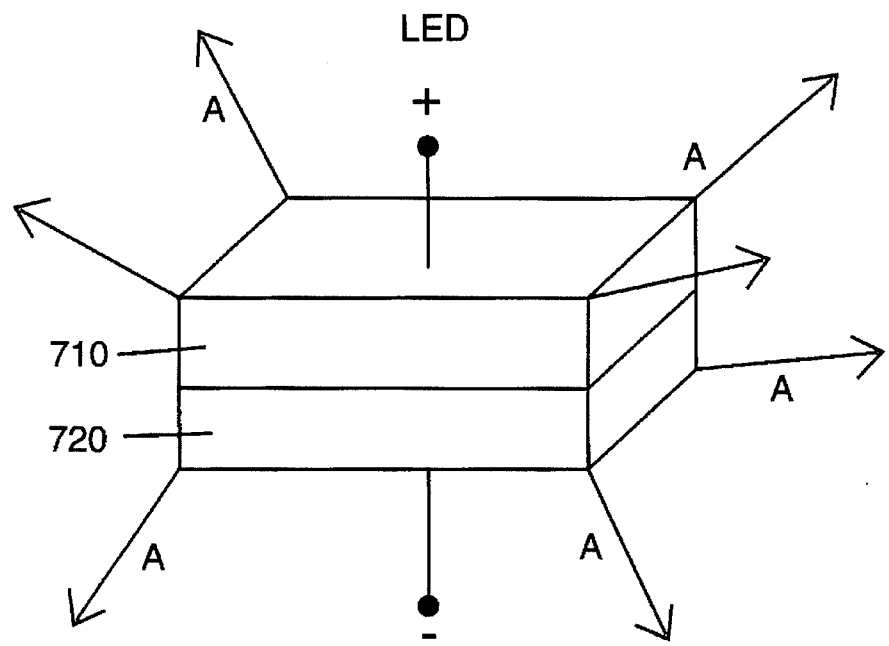
FIG. 7A and 7B illustrate the typical structure of LED and LD, respectively, showing that a Fabry-Perot cavity is needed for the LD.
Figure 7B:
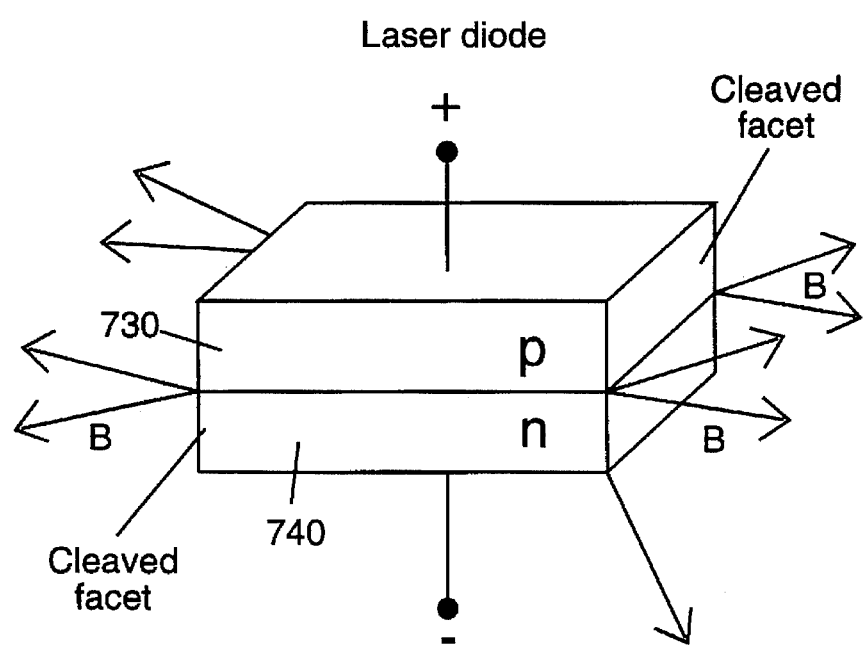
Figure 8:
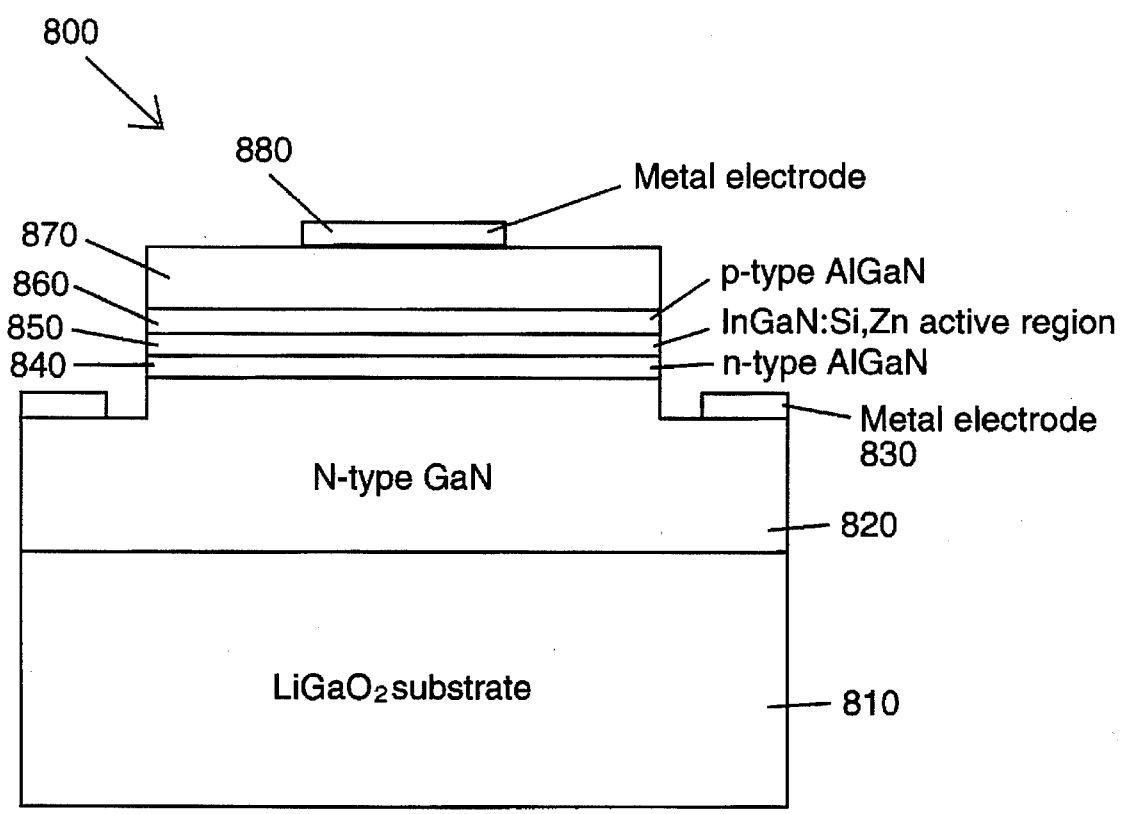
FIG. 8 illustrates one of the typical III–V nitride heterostructure device which can be used for either LD or LED depending on whether a Fabry-Perot cavity is provided or not.

Comparing the lattice constants listed in Table 2, it is clear that $LiGaO_2$ can match exactly to the $Ga_{1-x}In_xN$ composition whereas $LiAlO_2$ can match exactly to the $Al_xGa_{1-x}N$ composition. To generate light emitting action along arrow A in a light emitting diode (LED), a p-n junction 710, 720 is produced as shown in FIG. 7A. To generate light emitting action along arrow B in a laser diode, a p-n junction 730, 740 is produced as shown in FIG. 7B. It is made in the following manner. A 2 to 5 µm thick single crystal epitaxial layer of GaN is first grown on a (001) oriented $LiGaO_2$ substrate. The as-grown GaN epitaxial thin film is always n-type due to nitrogen holes with carrier concentration in the range of $10^{18}$–$10^{19}$ cm$^{-3}$. The theoretical bandgap of GaN is quite high (3.35 eV) which is in the UV region (370 nm). To generate the blue (≈470 nm), green (≈520 nm) and red (≈630 nm) colors will require the reduction of bandgap of the p-n junction which can be achieved by In substitution in the $Ga_{1-x}In_xN$ epitaxial layer. The In is delivered through a second orifice with a high purity In oven. To produce the p-n junction of appropriate bandgap, a layer of 0.3 to 1 µm thick of n-type (Si doped) $Ga_{1-x}In_xN$ is first deposited on top of the GaN followed by a second deposition of 0.3 to 1 µm thick p-doped $Ga_{1-x}In_xN$ epitaxial layer. The p-type dopant is delivered by using a third orifice which provides the metal vapor of Mg, Zn, Be or Li. A final 0.5–3 µm thick p-type GaN cladding layer is deposited to complete the typical p-n homojunction. Following the experience of GaAs laser LED and LD technology, a double heterostructure is produced. This is achieved by depositing a thin (0.2 µm) p-type $Ga_{1-y}In_yN$ layer, known as the active layer, sandwiched between the two thicker n-type and p-type injection layers as shown by the FIG. 8 structure. FIG. 8 illustrates a cross-sectional view of a III–V nitride heterostructure light emitting device consisting of a $LiGaO_2$ substrate 810, a N-type GaN layer 820 with metal electrodes 830 and a n-type AlGaN layer 840 thereon, an active region of InN:Si, Zn layer 850, a p-type AlGaN layer 860, p-type GaN layer 870, and metal electrode 880. The structure 800 of FIG. 8 can be used for the LED of FIG. 7A, and the Laser Diode of FIG. 7B. The active region can confine both electrons and holes in a small region and thus increases gain and reduces the current. The active layer has smaller bandgap than either side of the injection layers, or y>x. The introduction of active layer can have one more advantage, i.e., to reduce lattice strains and thus defects due to In substitution. As shown in FIG. 2, substituting Ga with In will greatly increases the lattice constant. With stepwise increase of In from injection layers to active layers will help to reduce the stress. To produce red light in GaN system will require large In substitution In this case, it is necessary to grow multiple layers to stepwise increase and decrease the In content.

In addition to the visible LEDs, we can produce ultraviolet (UV) LEDs. The GaN has an intrinsic bandgap of 3.35 eV and thus is capable to make long UV LED based on the $Ga_{1-x}In_xN$ epitaxial layer on $LiGaO_2$. However, it would be much easier to work on the $Ga_{1-x}Al_xN$ epitaxial layer on $LiAlO_2$. The AlN has an intrinsic bandgap of 6.15 eV or 265 nm. The UV LED is made in the following manner. A 2 to 5 μm thick latticed matched single crystal epitaxial layer of $Ga_{1-x}Al_xN$ is first grown on a (100) orientation of $LiAlO_2$ substrate. The as-grown $Ga_{1-x}Al_xN$ epitaxial thin film is also n-type due to nitrogen holes. The Al is delivered through a fourth orifice with a high purity Al oven. To produce the p-n junction of appropriate bandgap, a layer of 0.3 to 1 μm thick of n-type $Ga_{1-y}Al_yN$ is first deposited on top of the $Ga_{1-x}Al_xN$ followed by a second deposition of 0.3 to 1 μm thick p-doped $Ga_{1-y}Al_yN$ epitaxial layer (x>y). The p-type dopant is delivered by using a third orifice which provides the metal vapor of Mg, Zn, Be or Li. A final 0.5–3 μm thick p-type $Ga_{1-x}Al_xN$ cladding layer is deposited to complete the typical p-n homojunction. Similar to the $Ga_{1-x}In_xN$ LED case, a double heterostructure is produced. This is achieved by depositing a thin (0.2 μm) p-type $Ga_{1-z}Al_zN$ layer, known as the active layer, sandwiched between the two thicker n-type and p-type injection layers as shown by layers 840, 850, and 860 of FIG. 8. The active region can confine both electrons and holes in a small region and thus increases gain and reduces the current. The active layer has smaller bandgap than either side of the injection layers, or y>z. The introduction of active layer can only slightly reduce lattice strains since as shown in FIG. 2, substituting Ga with Al will only slightly reduces the lattice constant. There is no need to stepwise reduction of Al from injection layers to active layer.

By attaching the metal electrodes on both the n- and p-region, a LED device is produced.

FOURTH EMBODIMENT

Figure 9A:
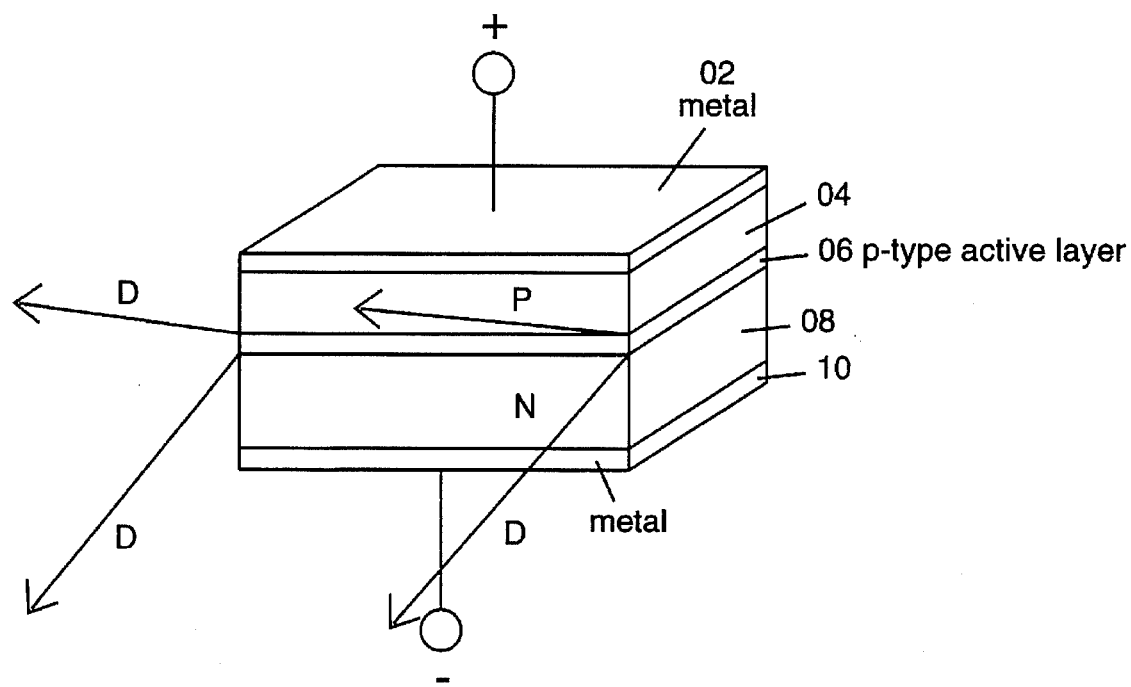
FIG. 9A, 9B, and 9C illustrates the basic, the gain-guided and index guided double heterostructures.
Figure 9B:
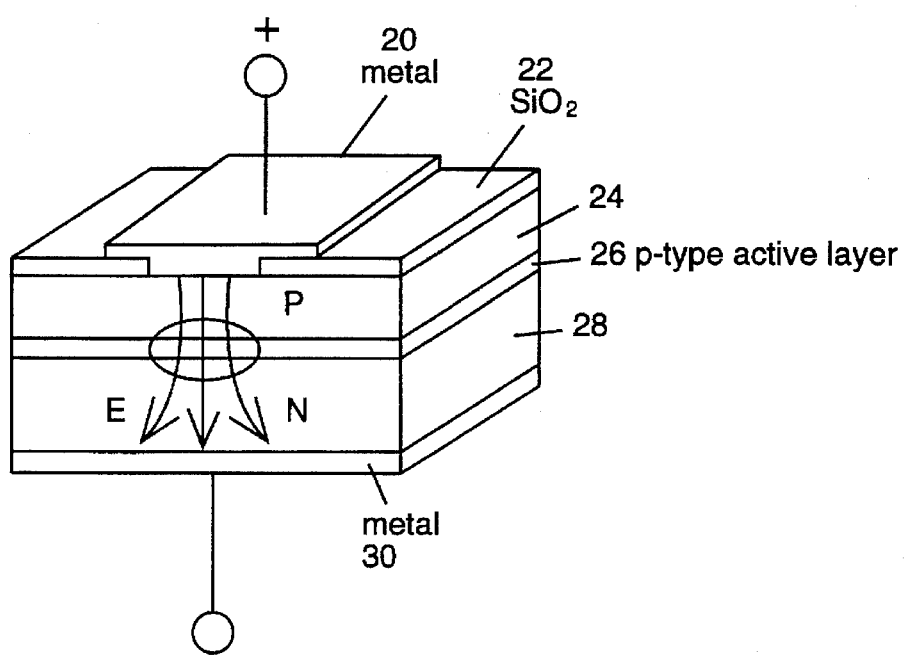
Figure 9C:
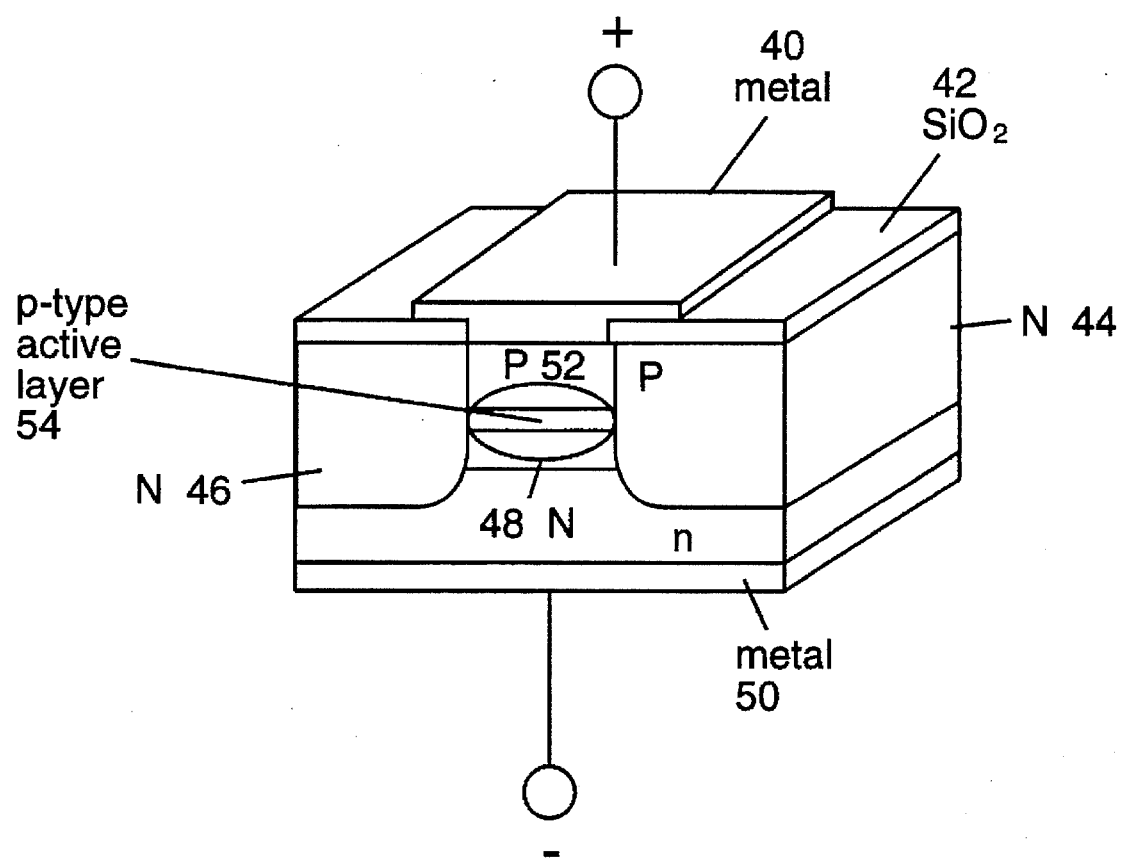

The fourth embodiment will describe the epitaxial deposition of single crystal III–V nitride compound semiconductor thin films on these substrates and the adjustment of the bandgaps to produce wide range of colors from ultraviolet (UV) to red for the manufacturing of laser diodes (LDs). In this case, the method of fabricating the $Ga_{1-x}In_xN$ epitaxial layer on $LiGaO_2$ substrate is identical to that described in the, third embodiment. A double heterostructure active layer is absolutely necessary to increase gain and reduce current (and thus heat generation). See FIG. 8. It is possible to further increase gain by reducing the two-dimensional heterostructure into single stripe (or one dimension). The stripe can be either gain-guided or index-guided as shown in FIGS. 9A, 9B and 9C. Both stripe structures are well known in the art of infra-red semiconductor laser diodes. The same geometry can also be applied to the present system. FIG. 9A illustrates the basic double heterostructure with metal electrodes 802, 810, P layer 804, N layer 808 with p-type active layer 806 therebetween and light emitting along arrow D. FIG. 9B illustrates a gain-guided double heterostructure with metal electrodes 820, 830 $SiO_2$ layer 822, P layer 824, N layer 828 and p-type active layer 826 therebetween and light emitting along arrow E. FIG. 9C illustrates a index-guided double heterostructure with metal electrodes 840, 850 N type layers 844, 846, 848, P type layer 852, with P-type active layer 854 therebetween.

In addition to the double heterostructure, the active layer can be made of single or multiple quantum wells which is produced in the following manner. After the deposition of the n-type (Si-doped, for example) $Ga_{1-x}In_xN$ injection layer, a series (two or more) of thin (50–100Å thick) $Ga_{1-y}In_yN$ quantum well layers are grown in sandwich with a thicker (200–500Å) $Ga_{1-x}In_xN$ confinement layers (y>x) before the final growth of the thick p-type $Ga_{1-x}In_xN$ injection layer. Thin quantum well structure limits the motion of electrons and holes in one dimension and also makes the population inversion easier to achieve. With a thin layer structure, both the conduction and the valence bands are spliced into discrete subbands. In this case the wavelength of the emitting light can be manipulated by varying the thickness of the active layers. The quantum well structure can also be made with either gain-guided or index-guided configurations. Again these types of structures are well known in the art of infra-red semiconductor laser diodes.

The same method can be used to fabricate the $Ga_{1-x}Al_xN$ epitaxial layer on $LiAlO_2$ substrate for UV laser diodes.

To achieve lasing a resonant cavity is needed. In the conventional GaAs based infra-red semiconductor laser diodes, the Fabry-Perot resonant cavity is produced by cleaving two parallel faces perpendicular to the junction plane as shown in FIGS. 7A and 7B. An alternative design is the vertical cavity surface emitting lasers (VCSEL) with distributed Bragg reflectors (DBR). Again these types of structures are well known in the art of infra-red semiconductor laser diodes. In the case of III–V nitride compound semiconductor materials, it is a little more complicated. This is because neither the nitrides nor the $LiAlO_2$ and $LiGaO_2$ substrates has any cleavage planes. To make the Fabry-Perot cavity will require physical or chemical etching. Again, only single crystal epitaxial thin films with low dislocation density can produce smooth etched faces to form the resonant cavity. An alternative way is to use $Li_2SiO_3$ and $Li_2GeO_3$ substrates instead. Because of the ordering of the two Li ions with Si or Ge ion, the crystals have perfect (100) cleavage plane. Again, the $Li_2GeO_3$ can match exactly to the $Ga_{1-x}In_xN$ composition whereas $Li_2SiO_3$ can match exactly to the $Al_xGa_{1-x}N$ composition. It is possible to use the same embodiment procedure to grow single crystal epitaxial films of the III–V nitride compound semiconductors on these two substrates. Because of the natural cleavage plane, it is possible to produce cleaved surfaces to form the Fabry-Perot resonant cavities. Also because of the perfect cleavage plane, the physical strength of both $Li_2SiO_3$ and $Li_2GeO_3$ substrates is much weaker.

Figure 10:
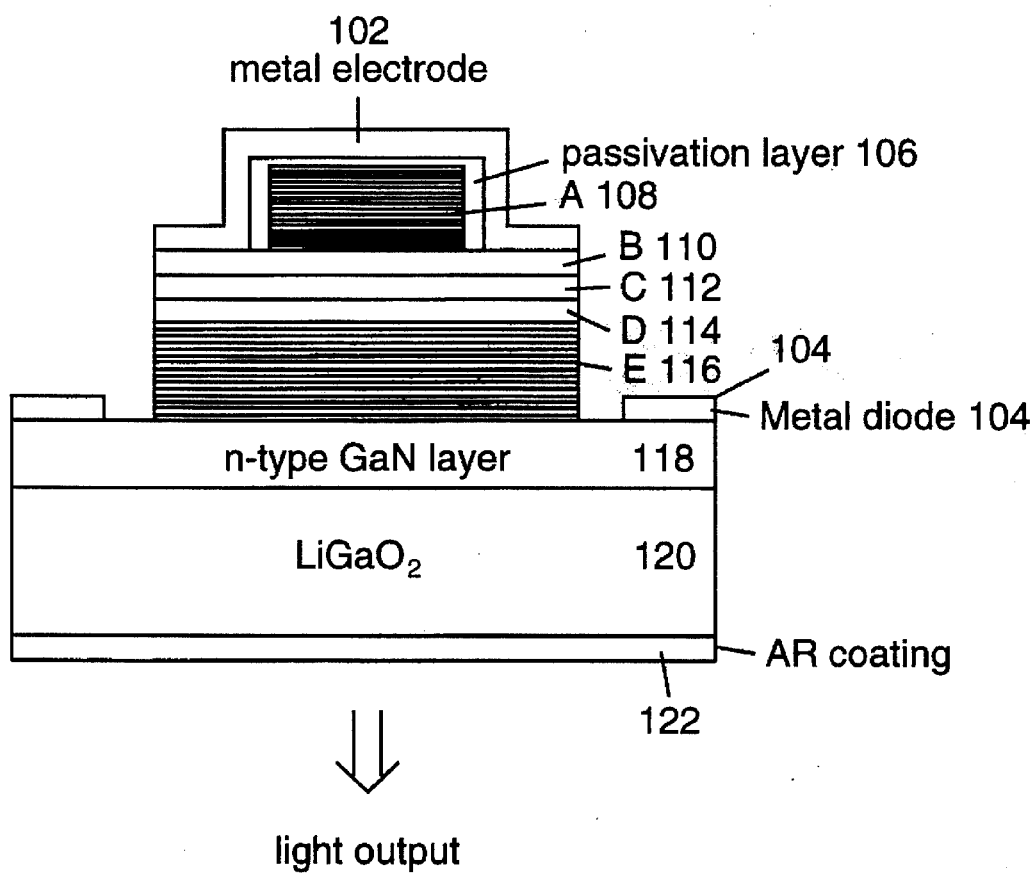
FIG. 10 illustrates the basic etched-pillar vertical-cavity surface emitting laser diode.

A third alternative is to make the vertical cavity surface emitting lasers (VCSEL) with distributed Bragg reflectors (DBR) as shown in FIG. 10. In this case, After the deposition of the n-type (Si-doped, for example) $Ga_{1-x}In_xN$ base layer, a stack of multiple layers (20 to 30 typically but not limited to) of n-doped bottom Bragg reflectors is grown. It consists of quarter wave stacks of $Ga_{1-x}Al_xN$ and $Ga_{1-y}In_yN$ layers. After the deposition of the active layers, whether it is a double heterojunction or quantum wells, a stack of multiple layers (20 to 30 typically but not limited to) of p-doped top Bragg reflectors is also grown with similar $Ga_{1-x}Al_xN$ and $Ga_{1-y}In_yN$ alternate layers. The top DBR layers is dry etched into mesa (or pillar) shape and served as p-type contact. It will also enhance the reflectivity. The light is emitted from the bottom through the substrate layer. Since the substrate material has lower refractive index and is highly transmissive, very low loss is expected by either scattering or absorption.

By attaching the metal electrodes on both the n- and p-region, a LD device is produced. FIG. 10 illustrates the basic etched-pillar vertical-cavity surface emitting laser diode consisting of metal electrodes 102, 104 substrate layer $LiGaO_2$ 120, n-type GaN layer 118, n-type AlGaN layer 116, n-type spacer layer AlGaN 114, InGaN:Si, Zn active region 112, p-type spacer layer AlGaN 110, p-type AlGaN layer 108 and passivation layer 106, with AR coating 122 and light emitting along arrow G.

FIFTH EMBODIMENT

The fifth embodiment will describe the epitaxial deposition of single crystal III–V nitride compound semiconductor thin films on these substrates and the adjustment of the bandgaps to respond wide range of colors from ultraviolet (UV) to red for the manufacturing of optical (including photoluminescence) sensors and detectors. The photoluminescence sensors and detectors, in principle, are the reversed biased diodes. Instead of using electric current to produce photon emissions, these devices sense the photons and convert them into electric current. As a result, the embodiment of manufacturing these photoluminescence sensors and detectors are exactly the same as the third embodiment. Light can be collected and concentrated by conventional optical lenses focused on these devices. The wavelength sensitivity of these devices depends entirely on the bandgap of the junction. Again the $Ga_{1-x}In_xN$ single crystal epitaxial film on $LiGaO_2$ can be used to sense wavelengths of the visible light whereas the $Al_xGa_{1-x}N$ single crystal epitaxial film on $LiAlO_2$ can be used as UV light sensor. Because of the high refractive indices of the III–V nitride films especially in the UV range, an anti-reflection (AR) coating may be needed to lower the reflection loss.

The metal electrodes on both the n- and p- region are attached to collect the electric current and a photoluminescence sensor or detector device is produced.

SIXTH EMBODIMENT

The sixth embodiment will describe the epitaxial deposition of single crystal III–V nitride compound semiconductor thin films on these substrates and the adjustment of the bandgaps to produce wide range of colors from ultraviolet (UV) to red for the manufacturing of optically pumped laser diodes (LDs). The method of manufacturing optically pumped LDs is identical to that of the manufacturing of electric pumped LDs described in the fourth embodiment. Since photons instead of electrons are used as pumping source, no electric leads are needed.

While the invention has been described, disclosed, illustrated and shown in various terms of certain embodiments or modifications which it has presumed in practice, the scope of the invention is not intended to be, nor should it be deemed to be, limited thereby and such other modifications or embodiments as may be suggested by the teachings herein are particularly reserved especially as they fall within the breadth and scope of the claims here appended.

I claim:

1. A semiconductor light device for LED, LD, optical sensors and optically pumped laser diodes, the device having a modified wurtzite structural oxide crystal substrate capable to lattice match to III–V nitride compound semiconductor thin films, the device comprising:

a substrate having at least a Lithium Aluminum Oxide ($LiAlO_2$) single crystal; and $Al_xIn_yGa_{1-x-y}N$, formed as epitaxial thin film layers on the substrate crystal, where $0 \leq x \leq 1$ and $0 \leq y \leq 1$ and $0 \leq x+y \leq 1$, whereby the crystal is lattice-matched to the thin film layer to form a semiconductor light device.

2. A semiconductor light device for LED, LD, optical sensors and optically pumped laser diodes, the device having a modified wurtzite structural oxide crystal substrate capable to lattice match to III–V nitride compound semiconductor thin films, the device comprising:

a substrate having at least a Lithium Gallium Oxide ($LiGaO_2$) single crystal; and $Al_xIn_yGa_{1-x-y}N$, formed as epitaxial thin film layers on the substrate crystal, where $0 \leq x \leq 1$ and $0 \leq y \leq 1$ and $0 \leq x+y \leq 1$, whereby the crystal is lattice-matched to the thin film layer to form a semiconductor light device.

3. A semiconductor light device for LED, LD, optical sensors and optically pumped laser diodes, the device having a modified wurtzite structural oxide crystal substrate capable to lattice match to III–V nitride compound semiconductor thin films, the device comprising:

a substrate having at least a Lithium Silicon Oxide ($Li_2SiO_3$) single crystal; and $Al_xIn_yGa_{1-x-y}N$, formed as epitaxial thin film layers on the substrate crystal, where $0 \leq x \leq 1$ and $0 \leq y \leq 1$ and $0 \leq x+y \leq 1$, whereby the crystal is lattice-matched to the thin film layer to form a semiconductor light device.

4. A semiconductor light device for LED, LD, optical sensors and optically pumped laser diodes, the device having a modified wurtzite structural oxide crystal substrate capable to lattice match to III–V nitride compound semiconductor thin films, the device comprising:

a substrate having at least a Lithium Germanium Oxide ($Li_2GeO_3$) single crystal; and $Al_xIn_yGa_{1-x-y}N$, formed as epitaxial thin film layers on the substrate crystal, where $0 \leq x \leq 1$ and $0 \leq y \leq 1$ and $0 \leq x+y \leq 1$, whereby the crystal is lattice-matched to the thin film layer to form a semiconductor light device.

5. A semiconductor light device for LED, LD, optical sensors and optically pumped laser diodes, the device having a modified wurtzite structural oxide crystal substrate capable to lattice match to III–V nitride compound semiconductor thin films, the device comprising:

a substrate having at least a Sodium Aluminum Oxide ($NaAlO_2$) single crystal; and $Al_xIn_yGa_{1-x-y}N$, formed as epitaxial thin film layers on the substrate crystal, where $0 \leq x \leq 1$ and $0 \leq y \leq 1$ and $0 \leq x+y \leq 1$, whereby the crystal is lattice-matched to the thin film layer to form a semiconductor light device.

6. A semiconductor light device for LED, LD, optical sensors and optically pumped laser diodes, the device having a modified wurtzite structural oxide crystal substrate capable to lattice match to III–V nitride compound semiconductor thin films, the device comprising:

a substrate having at least a Sodium Gallium Oxide ($NaGaO_2$) single crystal; and $Al_xIn_yGa_{1-x-y}N$, formed as epitaxial thin film layers on the substrate crystal, where $0 \leq x \leq 1$ and $0 \leq y \leq 1$ and $0 \leq x+y \leq 1$, whereby the crystal is lattice-matched to the thin film layer to form a semiconductor light device.

7. A semiconductor light device for LED, LD, optical sensors and optically pumped laser diodes, the device having a modified wurtzite structural oxide crystal substrate capable to lattice match to III–V nitride compound semiconductor thin films, the device comprising:

a substrate having at least a Sodium Germanium Oxide ($Na_2GeO_3$) single crystal; and $Al_xIn_yGa_{1-x-y}N$, formed as epitaxial thin film layers on the substrate crystal, where $0 \leq x \leq 1$ and $0 \leq y \leq 1$ and $0 \leq x+y \leq 1$, whereby the crystal is lattice-matched to the thin film layer to form a semiconductor light device.

8. A semiconductor light device for LED, LD, optical sensors and optically pumped laser diodes, the device having a modified wurtzite structural oxide crystal substrate capable to lattice match to III–V nitride compound semiconductor thin films, the device comprising:

a substrate having at least a Sodium Silicon Oxide ($Na_2SiO_3$) single crystal; and $Al_xIn_yGa_{1-x-y}N$, formed as epitaxial thin film layers on the substrate crystal, where $0 \leq x \leq 1$ and $0 \leq y \leq 1$ and $0 \leq x+y \leq 1$, whereby the crystal is lattice-matched to the thin film layer to form a semiconductor light device.

9. A semiconductor light device for LED, LD, optical sensors and optically pumped laser diodes, the device having a modified wurtzite structural oxide crystal substrate capable to lattice match to III–V nitride compound semiconductor thin films, the device comprising:

a substrate having at least a Lithium Phosphor Oxide ($Li_3PO_4$) single crystal; and $Al_xIn_yGa_{1-x-y}N$, formed as epitaxial thin film layers on the substrate crystal, where $0 \leq x \leq 1$ and $0 \leq y \leq 1$ and $0 \leq x+y \leq 1$, whereby the crystal is lattice-matched to the thin film layer to form a semiconductor light device.

10. A semiconductor light device for LED, LD, optical sensors and optically pumped laser diodes, the device having a modified wurtzite structural oxide crystal substrate capable to lattice match to III–V nitride compound semiconductor thin films, the device comprising:

a substrate having at least a Lithium Arsenic Oxide ($Li_3AsO_4$) single crystal; and $Al_xIn_yGa_{1-x-y}N$, formed as epitaxial thin film layers on the substrate crystal, where $0 \leq x \leq 1$ and $0 \leq y \leq 1$ and $0 \leq x+y \leq 1$, whereby the crystal is lattice-matched to the thin film layer to form a semiconductor light device.

11. A semiconductor light device for LED, LD, optical sensors and optically pumped laser diodes, the device having a modified wurtzite structural oxide crystal substrate capable to lattice match to III–V nitride compound semiconductor thin films, the device comprising:

a substrate having at least a Lithium Vanadium Oxide ($Li_3VO_4$) single crystal; and $Al_xIn_yGa_{1-x-y}N$, formed as epitaxial thin film layers on the substrate crystal, where $0 \leq x \leq 1$ and $0 \leq y \leq 1$ and $0 \leq x+y \leq 1$, whereby the crystal is lattice-matched to the thin film layer to form a semiconductor light device.

12. A semiconductor light device for LED, LD, optical sensors and optically pumped laser diodes, the device having a modified wurtzite structural oxide crystal substrate capable to lattice match to III–V nitride compound semiconductor thin films, the device comprising:

a substrate having at least a Lithium Magnesium Germanium Oxide ($Li_2MgGeO_4$) single crystal; and $Al_xIn_yGa_{1-x-y}N$, formed as epitaxial thin film layers on the substrate crystal, where $0 \leq x \leq 1$ and $0 \leq y \leq 1$ and $0 \leq x+y \leq 1$, whereby the crystal is lattice-matched to the thin film layer to form a semiconductor light device.

13. A semiconductor light device for LED, LD, optical sensors and optically pumped laser diodes, the device having a modified wurtzite structural oxide crystal substrate capable to lattice match to III–V nitride compound semiconductor thin films, the device comprising:

a substrate having at least a Lithium Zinc Germanium Oxide ($Li_2ZnGeO_4$) single crystal; and $Al_xIn_yGa_{1-x-y}N$, formed as epitaxial thin film layers on the substrate crystal, where $0 \leq x \leq 1$ and $0 \leq y \leq 1$ and $0 \leq x+y \leq 1$, whereby the crystal is lattice-matched to the thin film layer to form a semiconductor light device.

14. A semiconductor light device for LED, LD, optical sensors and optically pumped laser diodes, the device having a modified wurtzite structural oxide crystal substrate capable to lattice match to III–V nitride compound semiconductor thin films, the device comprising:

a substrate having at least a Lithium Cadmium Germanium Oxide ($Li_2CdGeO_4$) single crystal; and $Al_xIn_yGa_{1-x-y}N$, formed as epitaxial thin film layers on the substrate crystal, where $0 \leq x \leq 1$ and $0 \leq y \leq 1$ and $0 \leq x+y \leq 1$, whereby the crystal is lattice-matched to the thin film layer to form a semiconductor light device.

15. A semiconductor light device for LED, LD, optical sensors and optically pumped laser diodes, the device having a modified wurtzite structural oxide crystal substrate capable to lattice match to III–V nitride compound semiconductor thin films, the device comprising:

a substrate having at least a Lithium Magnesium Silicon Oxide ($Li_2MgSiO_4$) single crystal; and $Al_xIn_yGa_{1-x-y}N$, formed as epitaxial thin film layers on the substrate crystal, where $0 \leq x \leq 1$ and $0 \leq y \leq 1$ and $0 \leq x+y \leq 1$, whereby the crystal is lattice-matched to the thin film layer to form a semiconductor light device.

16. A semiconductor light device for LED, LD, optical sensors and optically pumped laser diodes, the device having a modified wurtzite structural oxide crystal substrate capable to lattice match to III–V nitride compound semiconductor thin films, the device comprising:

a substrate having at least a Lithium Zinc Silicon Oxide ($Li_2ZnSiO_4$) single crystal; and $Al_xIn_yGa_{1-x-y}N$, formed as epitaxial thin film layers on the substrate crystal, where $0 \leq x \leq 1$ and $0 \leq y \leq 1$ and $0 \leq x+y \leq 1$, whereby the crystal is lattice-matched to the thin film layer to form a semiconductor light device.

17. A semiconductor light device for LED, LD, optical sensors and optically pumped laser diodes, the device having a modified wurtzite structural oxide crystal substrate capable to lattice match to III–V nitride compound semiconductor thin films, the device comprising:

a substrate having at least a Lithium Cadmium Silicon Oxide ($Li_2CdSiO_4$) single crystal; and $Al_xIn_yGa_{1-x-y}N$, formed as epitaxial thin film layers on the substrate crystal, where $0 \leq x \leq 1$ and $0 \leq y \leq 1$ and $0 \leq x+y \leq 1$, whereby the crystal is lattice-matched to the thin film layer to form a semiconductor light device.

18. A semiconductor light device for LED, LD, optical sensors and optically pumped laser diodes, the device having a modified wurtzite structural oxide crystal substrate capable to lattice match to III–V nitride compound semiconductor thin films, the device comprising:

a substrate having at least a Sodium Magnesium Germanium Oxide ($Na_2MgGeO_4$) single crystal; and $Al_xIn_yGa_{1-x-y}N$, formed as epitaxial thin film layers on the substrate crystal, where $0 \leq x \leq 1$ and $0 \leq y \leq 1$ and $0 \leq x+y \leq 1$, whereby the crystal is lattice-matched to the thin film layer to form a semiconductor light device.

19. A semiconductor light device for LED, LD, optical sensors and optically pumped laser diodes, the device having a modified wurtzite structural oxide crystal substrate capable to lattice match to III–V nitride compound semiconductor thin films, the device comprising:

a substrate having at least a Sodium Zinc Germanium Oxide ($Na_2ZnGeO_4$) single crystal; and $Al_xIn_yGa_{1-x-y}N$, formed as epitaxial thin film layers on the substrate crystal, where $0 \leq x \leq 1$ and $0 \leq y \leq 1$ and $0 \leq x+y \leq 1$, whereby the crystal is lattice-matched to the thin film layer to form a semiconductor light device.

20. A semiconductor light device for LED, LD, optical sensors and optically pumped laser diodes, the device having a modified wurtzite structural oxide crystal substrate capable to lattice match to III–V nitride compound semiconductor thin films, the device comprising:

a substrate having at least a Sodium Zinc Silicon Oxide ($Na_2ZnSiO_4$) single crystal; and $Al_xIn_yGa_{1-x-y}N$, formed as epitaxial thin film layers on the substrate crystal, where $0 \leq x \leq 1$ and $0 \leq y \leq 1$ and $0 \leq x+y \leq 1$, whereby the crystal is lattice-matched to the thin film layer to form a semiconductor light device.

* * * * *